(12) United States Patent
Inoue

(10) Patent No.: US 8,453,842 B2
(45) Date of Patent: Jun. 4, 2013

(54) SEMICONDUCTOR WAFER CONTAINER

(75) Inventor: Kazuya Inoue, Tokyo (JP)

(73) Assignee: Miraial Co., Ltd., Tokyo (JP)

( * ) Notice: Subject to any disclaimer, the term of this patent is extended or adjusted under 35 U.S.C. 154(b) by 0 days.

(21) Appl. No.: 13/266,029

(22) PCT Filed: May 13, 2009

(86) PCT No.: PCT/JP2009/002073
§ 371 (c)(1),
(2), (4) Date: Oct. 24, 2011

(87) PCT Pub. No.: WO2010/131291
PCT Pub. Date: Nov. 18, 2010

(65) Prior Publication Data
US 2012/0043254 A1 Feb. 23, 2012

(51) Int. Cl.
*B65D 85/86* (2006.01)
(52) U.S. Cl.
USPC ............ 206/711; 206/710; 206/722; 206/454
(58) Field of Classification Search
USPC ................. 206/711, 710, 832, 833, 454, 722, 206/723, 712; 211/41.18
See application file for complete search history.

(56) References Cited

U.S. PATENT DOCUMENTS

| | | | | |
|---|---|---|---|---|
| 4,752,007 A | * | 6/1988 | Rossi et al. | 206/445 |
| 5,207,324 A | * | 5/1993 | Kos | 206/711 |
| 5,273,159 A | * | 12/1993 | Gregerson | 206/711 |
| 5,555,981 A | * | 9/1996 | Gregerson | 206/711 |
| 5,782,362 A | * | 7/1998 | Ohori | 206/711 |
| 5,816,410 A | * | 10/1998 | Nyseth | 206/711 |
| 5,992,638 A | * | 11/1999 | Gregerson et al. | 206/711 |
| 6,082,540 A | * | 7/2000 | Krampotich et al. | 206/445 |
| 6,267,245 B1 | * | 7/2001 | Bores et al. | 206/711 |
| 6,951,284 B2 | * | 10/2005 | Cheesman et al. | 206/711 |
| 7,344,031 B2 | * | 3/2008 | Hasegawa et al. | 206/710 |
| 7,823,730 B2 | * | 11/2010 | Mimura et al. | 206/710 |
| 7,900,776 B2 | * | 3/2011 | Burns et al. | 206/711 |
| 7,967,147 B2 | * | 6/2011 | Mimura | 206/711 |
| 8,118,169 B2 | * | 2/2012 | Hosoi et al. | 206/711 |
| 2005/0274645 A1 | * | 12/2005 | Hasegawa et al. | 206/710 |
| 2006/0283774 A1 | * | 12/2006 | Hasegawa et al. | 206/725 |
| 2009/0026109 A1 | * | 1/2009 | Hasegawa et al. | 206/711 |
| 2010/0258475 A1 | * | 10/2010 | Ogawa | 206/711 |

FOREIGN PATENT DOCUMENTS

| | | |
|---|---|---|
| JP | 2000-068363 | 3/2000 |
| JP | 2002-009142 | 1/2002 |
| JP | 2005-5525 | 1/2005 |
| JP | 2006-303228 | 11/2006 |

* cited by examiner

*Primary Examiner* — Steven A. Reynolds
(74) *Attorney, Agent, or Firm* — Greenblum & Bernstein P.L.C.

(57) ABSTRACT

Wafer protecting grooves (10) are provided on an innermost wall (1b) of a container body (1). The wafer protecting grooves have a cross-sectional configuration in the shape of undulations having bottoms (10b), which are most distant from an opening (1a), at respective positions facing the outer edges of semiconductor wafers (W), and having an opening width wider than the thickness of each semiconductor wafer (W). In a normal state, an imaginary line (Q) connecting together the tops of the undulations is inward of or at the same position as the outer edges of the semiconductor wafers (W) facing the imaginary line. Thus, it is possible to obtain superior impact resistance that makes the semiconductor wafers (W) in the container body (1) unlikely to be damaged even when a large impact is applied thereto by a fall or other handling errors.

5 Claims, 5 Drawing Sheets

[ I ]

[ II ]

[IV]

PRIOR ART

SEMICONDUCTOR WAFER CONTAINER

TECHNICAL FIELD

The present invention relates to semiconductor wafer containers.

BACKGROUND ART

A semiconductor wafer container that is widely and generally used has a container body with an opening for loading and unloading a plurality of semiconductor wafers, a cover externally removably attached to the opening to close the opening, wafer retaining means for retaining the plurality of semiconductor wafers individually and independently in the container body, and a front retainer disposed at the back side of the cover to elastically press the semiconductor wafers from the opening side toward the innermost side of the container body.

It should be noted that a semiconductor wafer may be damaged by the wafer retaining means, retainer or the like if the latter comes in plane contact with the semiconductor wafer. Therefore, the wafer retaining means, retainer or the like has a V-groove shaped cross-sectional configuration at a semiconductor wafer retaining portion thereof so as to contact only the ridges of the outer edge of a semiconductor wafer.

The structures of the wafer retaining means for retaining semiconductor wafers in such semiconductor wafer containers are roughly divided into two types. In the first type, V-groove shaped wafer retaining grooves (or rear retainer) are disposed on the inner surface of the innermost (as seen from the opening) part of the container body to retain semiconductor wafers therein by elastic pressing force applied from the front retainer provided on the cover.

In this regard, however, guide grooves are formed in rows on the inner surfaces of side walls of the container body at the opposite ends of the opening under the need of orderly guiding each semiconductor wafer inserted into the container body from the opening toward the innermost side of the container body.

The guide grooves need not have a V-shaped cross-sectional configuration. The semiconductor wafers come out of engagement with the guide grooves when clamped from the front and rear sides between the front retainer of V-shaped cross-sectional configuration and the V-groove shaped wafer retaining grooves (or rear retainer) (for example, Patent Literature 1).

In the second type of semiconductor wafer containers, V-groove shaped wafer retaining grooves are provided in rows and in mutually opposing pairs on the inner surfaces of side walls of the container body that are located at the opposite ends of the opening.

With this type, the wafer retaining grooves, which are provided on the side walls, per se are formed with wafer movement restraining portions that restrain inward movement of the semiconductor wafers so that the semiconductor wafers will not reach the innermost wall of the container body (for example, the distance between each pair of mutually opposing wafer retaining grooves is reduced at the innermost side thereof). At the innermost position in the container body, the outer edges of the semiconductor wafers are floating in the space without contacting the wall surface or the like of the container body (for example, Patent Literature 2).

Citation List
Patent Literatures
 Patent Literature 1: Japanese Patent Application Publication No. 2002-9142 FIG. 8 and so forth
 Patent Literature 2: Japanese Patent Application Publication No. 2000-68363

SUMMARY OF INVENTION

Technical Problem

Both the above-described two types of semiconductor wafer containers can retain semiconductor wafers orderly and surely in a normal state. However, if a large impact is applied to the container body due to a fall or other handling errors, some problems may arise in either of the two types.

That is, in the above-described first type of semiconductor wafer containers, if a strong force shakes a semiconductor wafer in the front-back direction as seen from the opening, the outer edge of the semiconductor wafer may momentarily disengage from the associated wafer retaining groove at the innermost side and may engage with a neighboring wafer retaining groove. This results in a plurality of semiconductor wafers engaged in one wafer retaining groove and unavoidably rubbing against each other and thus being damaged.

If a strong force shakes a semiconductor wafer in a direction perpendicular to a surface thereof, the semiconductor wafer surface is unavoidably brought into plane contact with the inner surface of the associated wafer guide groove on the side wall by strong force and thus damaged.

The above-described problem will not arise in the second type of semiconductor wafer containers as disclosed in Patent Literature 2, etc. However, if a strong force shakes a semiconductor wafer in the front-back direction as seen from the opening, as shown by the arrow A in FIG. 7, the semiconductor wafer W momentarily moves extensively toward the innermost wall 90 of the container body.

Consequently, the outer edge of the semiconductor wafer W strikes against the innermost wall 90 of the container body and thereafter moves draggingly along the surface of the innermost wall 90 to a considerable extent by momentum as shown by the two-dot chain lines. As a result, the semiconductor wafer W may be cracked. At the cover side (not shown) of the semiconductor wafer container, the semiconductor wafer W may disengage from the associated V-groove of the front retainer, causing a damage to the semiconductor wafer W.

An object of the present invention is to provide a semiconductor wafer container having superior impact resistance that makes semiconductor wafers contained therein unlikely to be damaged even when a large impact is applied thereto by a fall or other handling errors.

Solution to Problem

To attain the above-described object, the present invention provides a semiconductor wafer container including a container body having an opening for loading and unloading a plurality of semiconductor wafers, a cover externally removably attached to the opening to close the opening, and wafer retaining grooves provided in mutually opposing pairs on the inner surfaces of side walls of the container body at the opposite ends of the opening to retain the plurality of semiconductor wafers individually and independently in the container body. The wafer retaining grooves have wafer movement restraining portions restraining movement of the semiconductor wafers retained by the wafer retaining grooves so that the outer edges of the semiconductor wafers will not reach an innermost wall of the container body that is located opposite the opening. The semiconductor wafer container further includes a front retainer disposed at the back side of the cover to elastically press the semiconductor wafers retained by the wafer retaining grooves toward the innermost wall from the opening side. Further, the semiconductor wafer container includes wafer protecting grooves provided on the innermost wall of the container body. The wafer protecting grooves have a cross-sectional configuration in the shape of undulations having bottoms, which are most distant from the opening of the container body, at respective positions facing the outer edges of the semiconductor wafers retained by the wafer retaining grooves, and having an opening width wider than the thickness of each semiconductor wafer. In a normal state, an imaginary line connecting together the tops of the undulations is inward of or at the same position as the outer edges of the semiconductor wafers facing the imaginary line.

It should be noted that the wafer protecting grooves may have a substantially sinusoidal cross-sectional configuration. The wafer protecting grooves may be disposed in two rows parallel to the axes of the semiconductor wafers retained by the wafer retaining grooves, with a spacing between the two rows.

The wafer protecting grooves may have an arcuate shape parallel to the outer edges of the semiconductor wafers as seen in a direction parallel to the axes of the semiconductor wafers retained by the wafer retaining grooves. The wafer protecting grooves may be integrally molded with the container body.

Advantageous Effects of Invention

According to the present invention, wafer protecting grooves are provided on the innermost wall of the container body. The wafer protecting grooves have a cross-sectional configuration in the shape of undulations with an opening width wider than the thickness of each semiconductor wafer. In a normal state, an imaginary line connecting together the tops of the undulations is inward of or at the same position as the outer edges of the semiconductor wafers facing the imaginary line. Thus, it is possible to obtain superior impact resistance that makes the semiconductor wafers in the container body unlikely to be damaged even when a large impact is applied thereto by a fall or other handling errors.

DESCRIPTION OF EMBODIMENTS

An embodiment of the present invention will be explained below with reference to the accompanying drawings.

Figure 4:
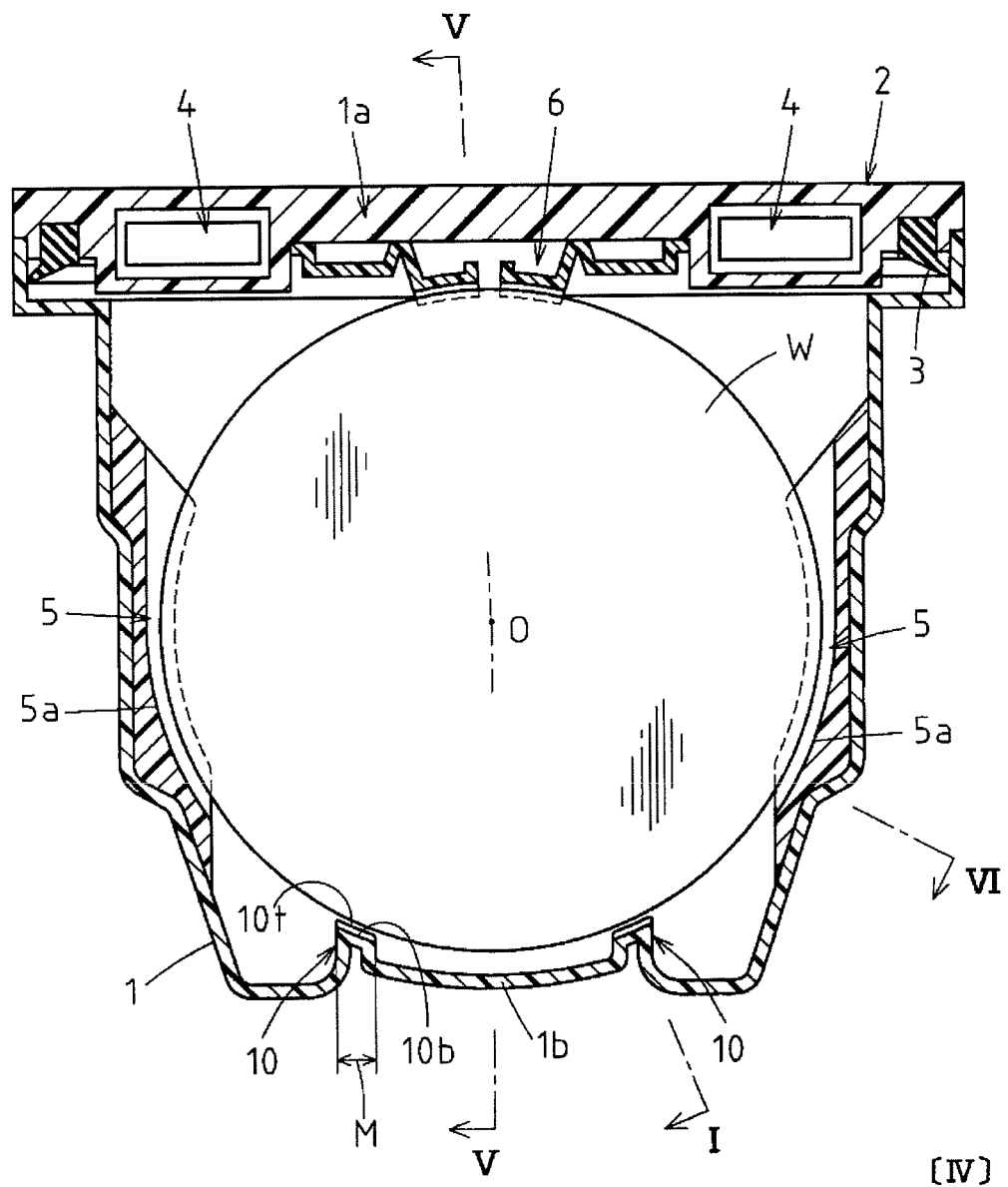
[FIG. 4] is a sectional front view of the semiconductor wafer container according to the first embodiment of the present invention.
Figure 5:
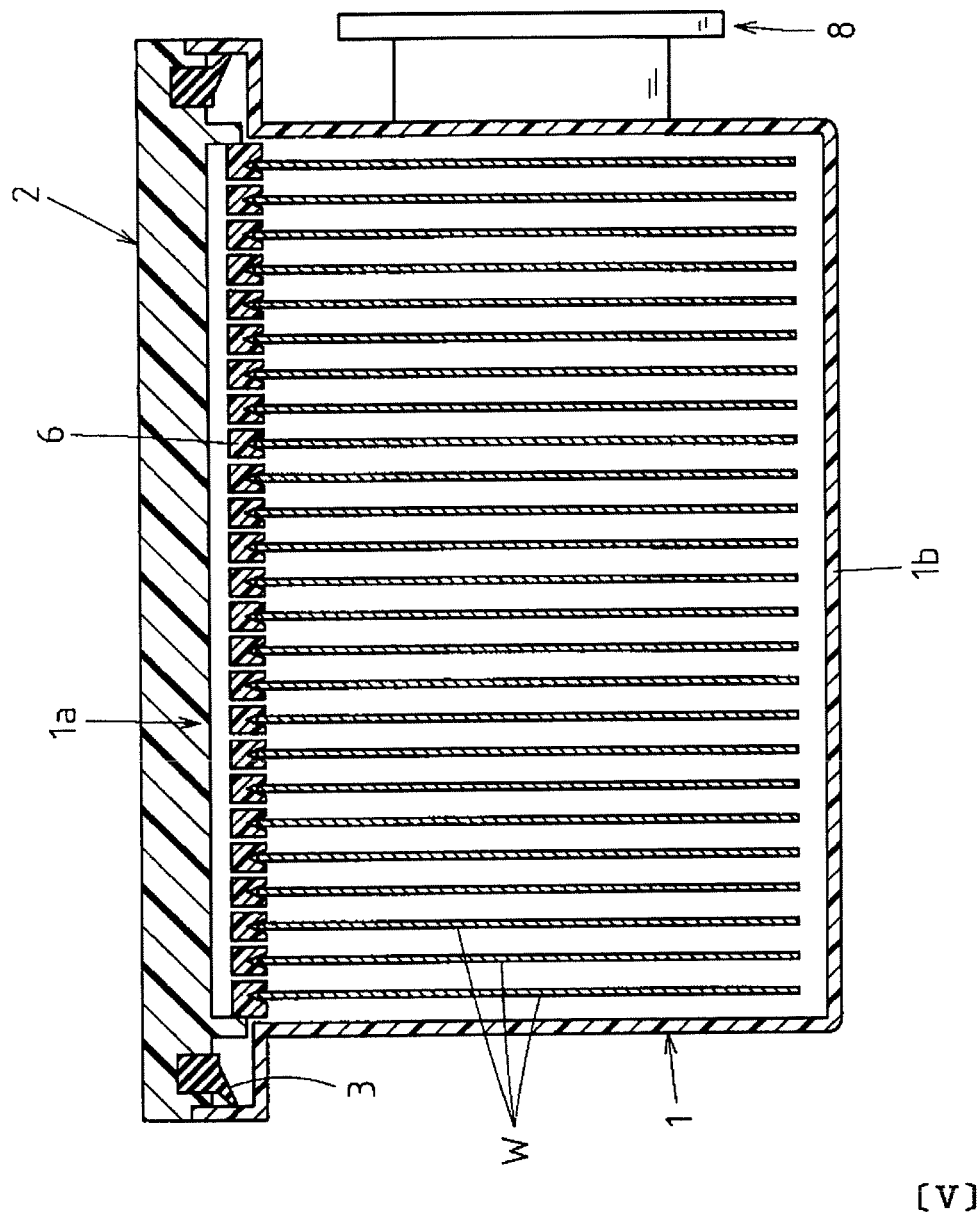
[FIG. 5] is a sectional side view (V-O-V section in FIG. 4) of the semiconductor wafer container according to the first embodiment of the present invention.

FIG. 4 is a sectional front view of a semiconductor wafer container, and FIG. 5 is a sectional view taken along the line V-O-V in FIG. 4. It should be noted that, in each sectional view, most of members or portions seen beyond the section plane are not shown.

Reference numeral 1 denotes a container body made of a plastic material, e.g. polycarbonate resin. The container body 1 is formed into a size capable of storing a plurality (25, for example) of semiconductor wafers W in parallel to each other, and has an opening 1a for loading and unloading a plurality of semiconductor wafers W. The opening 1a is formed in one side (upper side in FIG. 4) of the container body 1.

Reference numeral 2 denotes a cover externally removably attached to the opening 1a of the container body 1 to close the opening 1a. The cover 2 has a sealing packing 3 attached to the entire circumference thereof. The packing 3 comes in pressure contact with the inner peripheral surface of the opening 1a of the container body 1 to gas-tightly seal an interior space surrounded by the container body 1 and the cover 2. The cover 2 is equipped with a pair of latch mechanisms 4 or the like to lock the cover 2 to the container body 1.

Reference numeral 5 denotes wafer retaining grooves provided in mutually opposing pairs on the inner surfaces of side walls of the container body 1 at the opposite ends of the opening 1a so that the wafer retaining grooves 5 can retain a plurality of semiconductor wafers W individually and independently in the container body 1.

The wafer retaining grooves 5 are provided in 25 pairs, for example, in correspondence to the number of semiconductor wafers W. It should be noted that members that constitute the wafer retaining grooves 5 may be formed as members separate from the container body 1, or may be integrally molded with the container body 1.

Figure 6:
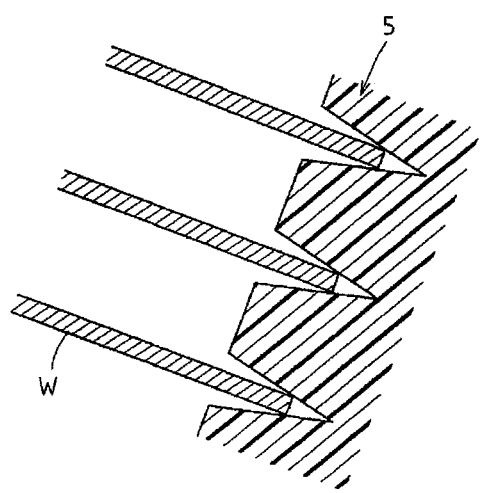
[FIG. 6] is a sectional view taken along the line VI-O in FIG. 4, showing the semiconductor wafer container according to the first embodiment of the present invention.
Figure 7:
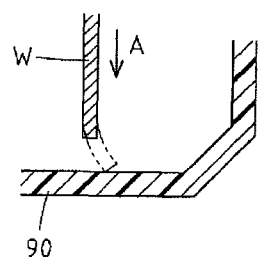
[FIG. 7] is a schematic view showing a conventional semiconductor wafer container when an impact is applied thereto due to a fall or other accident.

As shown in FIG. 6, which illustrates the VI-O section in FIG. 4, each wafer retaining groove 5 is formed in the shape of a V-groove having a substantially V-shaped cross-sectional configuration as seen from the opening 1a side. Consequently, each semiconductor wafer W engaged with a wafer retaining groove 5 is retained in such a manner that only the ridges of the outer edge thereof contact the wafer retaining groove 5.

As shown in FIG. 4, each wafer retaining groove 5 is formed such that a half of its inner part (i.e. inner part as seen from the opening 1a; lower part in FIG. 4) is arcuate along the outer edge of a semiconductor wafer W. The distance between each pair of mutually opposing (left and right) wafer retaining grooves 5 gradually decreases toward the innermost side.

Consequently, each pair of wafer retaining groove portions 5a, the distance between which gradually decreases, constitute wafer movement restraining portions that restrain inward movement of the associated semiconductor wafer W. In a normal state, the wafer movement restraining portions 5a restrain the movement of the semiconductor wafers W retained by the wafer retaining grooves 5 so that the semiconductor wafers W will not reach an innermost wall 1b of the container body 1 that is located opposite the opening 1a.

As shown in FIGS. 4 and 5, a front retainer 6 is installed at the back side of the cover 2 to elastically press the semiconductor wafers W retained by the wafer retaining grooves 5 toward the innermost wall 1b from the opening 1a side.

The front retainer 6 has V-grooves that are engaged with semiconductor wafers W individually. The V-grooves are formed in 25 rows, for example, at the same pitch as the wafer retaining grooves 5. Accordingly, when the cover 2 is fitted to the opening 1a after semiconductor wafers W have been inserted into the respective wafer retaining grooves 5 from the opening 1a, the semiconductor wafers W are elastically pushed inward of the container body 1 by the front retainer 6 and pressed against the wafer movement restraining portions 5a of the wafer retaining grooves 5, thereby being secured in a stable position.

Reference 8 shown in FIG. 5 denotes a container hanger 8 for engagement with an arm for suspending the semiconductor wafer container during conveyance or the like. When the semiconductor wafer container is carried, the container hanger 8 faces upward in the direction of gravity, and the semiconductor wafers W lie horizontally. On the other occasions, the semiconductor wafer container is stored in such a position that the semiconductor wafers W are upright as illustrated in the figures. The present invention, however, is not limited thereto.

As shown in FIG. 4, the innermost wall 1b of the container body 1 has wafer protecting grooves 10 provided facing the outer edges of the semiconductor wafers W to protect the wafers W when a strong force shakes the semiconductor wafers W in the front-back direction as seen from the opening 1a (i.e. in the vertical direction in FIG. 4) or in a direction oblique to the front-back direction due to a fall caused by a handling error, or other accident.

Figure 1:
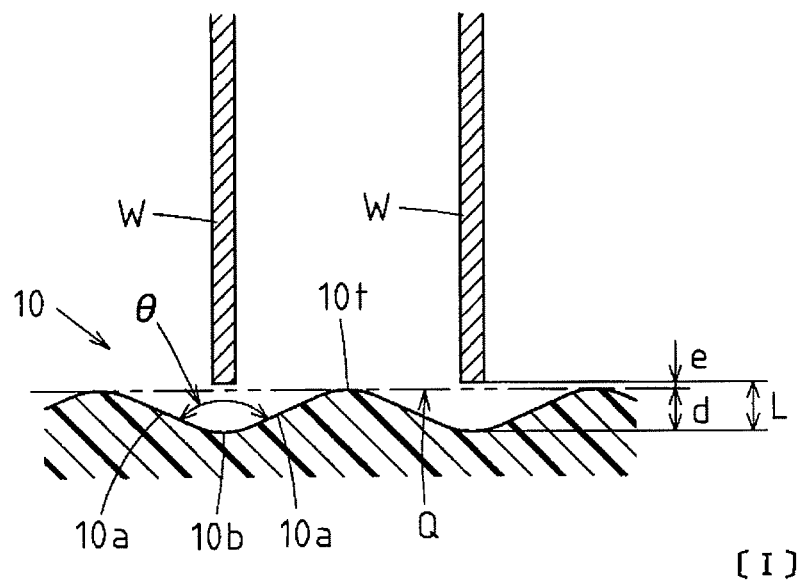
[FIG. 1] is an enlarged sectional view (I-O section in FIG. 4) of a wafer protecting groove part of a semiconductor wafer container according to a first embodiment of the present invention.
Figure 2:
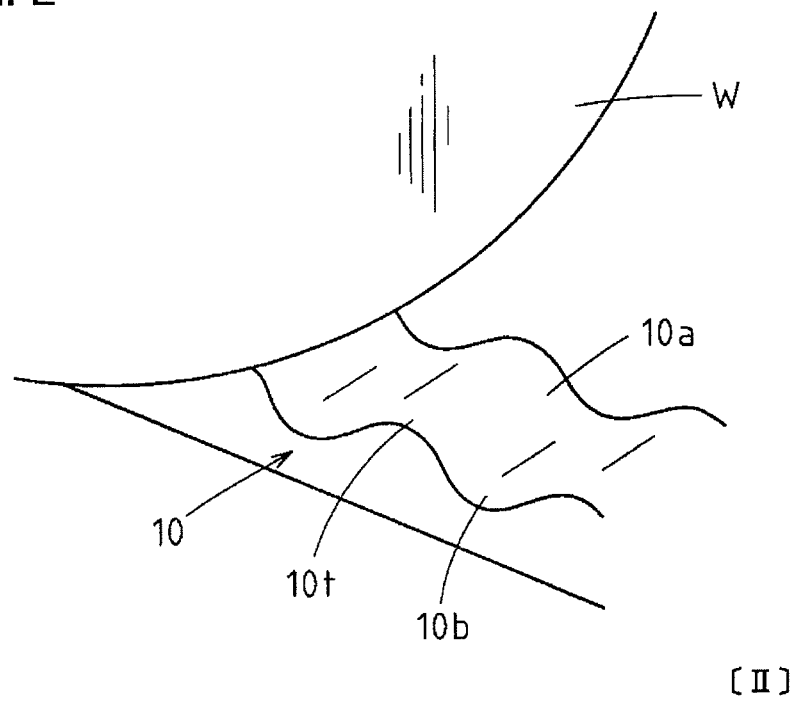
[FIG. 2] is an enlarged perspective view of the wafer protecting groove part of the semiconductor wafer container according to the first embodiment of the present invention.

As shown in FIG. 1, which is an enlarged view of the I-O section in FIG. 4, and in FIG. 2, which is a perspective view of FIG. 1, the wafer protecting grooves 10 have a cross-sectional configuration in the shape of undulations having bottoms 10b, which are most distant from the opening 1a, at respective positions facing the outer edges of the semiconductor wafers W, and having an opening width wider than the thickness of each semiconductor wafer W.

More specifically, the wafer protecting grooves 10 in this embodiment have a substantially sinusoidal cross-sectional configuration of the same pitch as the wafer retaining grooves 5 and the groove pitch of the front retainer 6. The wafer protecting grooves 10 having such a cross-sectional configuration can be formed into a precise shape without distortion. The number of bottoms 10b is the same as the number of wafer retaining grooves 5 and the number of grooves of the front retainer 6.

As shown in FIG. 4, the wafer protecting grooves 10 are provided in two rows parallel to the axes of the semiconductor wafers W retained by the wafer retaining grooves 5, with a spacing between the two rows. That is, two rows of wafer protecting grooves 10 are disposed at two sides, respectively, facing each other across a position directly below the centers of the semiconductor wafers W.

Each wafer protecting groove 10 has a groove length M of the order of 3 mm to 30 mm, for example. Setting the groove length M of each wafer protecting groove 10 to such a short length allows a reduction in the amount of dust generated when the wafer protecting grooves 10 contact the semiconductor wafers W.

It should be noted that the wafer protecting grooves 10 in this embodiment are provided on the tips of rib-shaped portions projecting inward from the innermost wall 1b of the container body 1, which are formed to increase the rigidity of the innermost wall 1b. The wafer protecting grooves 10 are integrally molded with the container body 1. However, the arrangement may be such that members for constituting wafer protecting grooves 10 are formed as components separate from the container body 1 and attached to the innermost wall 1b of the container body 1.

Each wafer protecting groove 10 (i.e. the bottom 10b and top 10t of each wafer protecting groove 10) has, as shown in FIG. 4, an arcuate shape parallel to the outer edge of the semiconductor wafer W as seen in a direction parallel to the axes of the semiconductor wafers W retained by the wafer retaining grooves 5.

However, each wafer protecting groove 10 faces a very short region of the outer edge of the semiconductor wafer W, and the outer edge of the semiconductor wafer W is close to a straight line in that region. Therefore, each wafer protecting groove 10 may be formed in a straight line shape substantially parallel to the outer edge of the semiconductor wafer W.

As shown in FIG. 1, each wafer protecting groove 10 is formed so that the angle $\theta$ at the bottom 10b (i.e. the angle made by the opposing groove surfaces 10a of the wafer protecting groove 10) is of the order of from 120° to 140° in this embodiment. However, the wafer protecting grooves 10 can substantially exhibit the function of protecting the semiconductor wafers W from an impact, provided that $\theta$ is in the range of the order of from 60° to 160°.

In addition, the wafer protecting grooves 10 are formed so that, when no impact or the like is applied to the semiconductor wafer container, the imaginary line Q connecting together the tops 10t of the undulations is inward of or at the same position as the outer edges of the semiconductor wafers W facing the imaginary line Q. That is, in FIG. 1, $e \geq 0$.

Accordingly, if the semiconductor wafers W shake to a considerable extent when a strong force acts thereon in a direction perpendicular to the surfaces of the semiconductor wafers W, for example, the semiconductor wafers W do not contact the wafer protecting grooves 10, and there is no fear of damaging the semiconductor wafers W.

The distance L between the outer edge of each semiconductor wafer W and the bottom 10b of the associated wafer protecting groove 10 is set in the range of the order of from 1 mm to 3 mm, for example. Setting the distance L to such a small value prevents the semiconductor wafers W from disengaging from the front retainer 6 at the cover 2 side even if the semiconductor wafers W shake in the front-back direction as seen from the opening 1a (i.e. in the vertical direction in FIG. 4).

Figure 3:
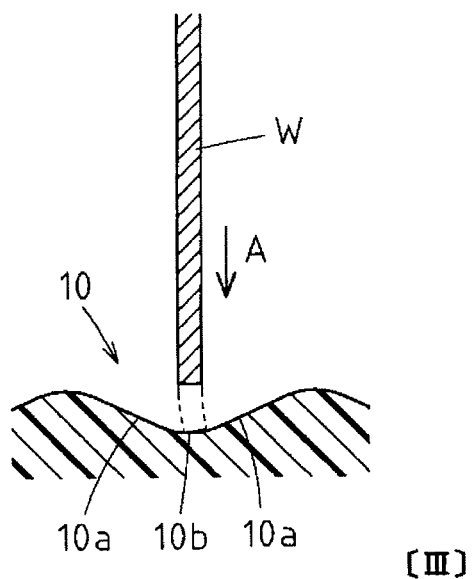
[FIG. 3] is an enlarged sectional view showing the wafer protecting groove part of the semiconductor wafer container according to the first embodiment of the present invention when an impact is applied to the semiconductor wafer container due to a fall or other accident.

With the semiconductor wafer container arranged as stated above, when a strong force shakes the semiconductor wafers W in the front-back direction as seen from the opening 1a due to a fall, for example, each semiconductor wafer W momentarily moves extensively toward the innermost wall 1b of the container body 1 as shown by the arrow A in FIG. 3.

Consequently, the outer edge of the semiconductor wafer W strikes against the innermost wall 1b of the container body 1, and thereafter, the semiconductor wafer W is urged to move sideways by momentum. However, the sideways movement of the semiconductor wafer W is suppressed (but not locked) by the groove surfaces 10a of the undulated wafer protecting groove 10, as shown by the two-dot chain lines.

As a result, there are no such phenomena that the outer edge of the semiconductor wafer W drags sideways extensively, causing the semiconductor wafer W to be cracked, and that the semiconductor wafer W disengages from the V-groove of the front retainer 6 at the cover 2 side. Accordingly, the semiconductor wafer W can avoid being damaged. The wafer protecting grooves 10 can stably exhibit the function of protecting the semiconductor wafers W because two rows of wafer protecting grooves 10 are dividedly disposed at two sides facing each other across a position directly below the centers of the semiconductor wafers W.

It should be noted that the groove depth D of the wafer protecting grooves 10 (i.e. the level difference between the bottom 10b and the top 10t) should preferably be set in the range of the order of from 2 mm to 4 mm, for example. Setting the groove depth D to such a value makes it possible to surely provide the function of protecting the semiconductor wafers W from an impact as stated above.

REFERENCE SIGNS LIST

1: container body
1a: opening
1b: innermost wall
2: cover
5: wafer retaining groove
5a: wafer movement restraining portion
6: front retainer
10: wafer protecting groove
10a: groove surface
10b: bottom
10t: top
Q: imaginary line
W: semiconductor wafer

The invention claimed is:

1. A semiconductor wafer container comprising:
a container body having an opening for loading and unloading a plurality of semiconductor wafers;
a cover externally removably attached to the opening to close the opening;
wafer retaining grooves provided in mutually opposing pairs on inner surfaces of side walls of the container body at opposite ends of the opening to retain the plurality of semiconductor wafers individually and independently in the container body, the wafer retaining grooves having wafer movement restraining portions restraining movement of the semiconductor wafers retained by the wafer retaining grooves so that outer edges of the semiconductor wafers will not reach an innermost wall of the container body that is located opposite the opening; and
a front retainer disposed at a back side of the cover to elastically press the semiconductor wafers retained by the wafer retaining grooves toward the innermost wall from a side of the container body closer to the opening;
the semiconductor wafer container further comprising:
wafer protecting grooves provided on the innermost wall of the container body, the wafer protecting grooves having a cross-sectional configuration in a shape of undulations having bottoms, which are most distant from the opening, at respective positions facing the outer edges of the semiconductor wafers retained by the wafer retaining grooves, and having an opening width wider than a thickness of each of the semiconductor wafers, the wafer protecting grooves being configured so that, in a normal state where a strong force does not shake the semiconductor wafers, an imaginary line connecting together tops of the undulations is inward of the bottoms of the undulations toward the center of the container and outward of the wafer edges away from the center of the container forming a space between the imaginary line and the outer edges of the wafer.

2. The semiconductor wafer container of claim 1, wherein the wafer protecting grooves have a substantially sinusoidal cross-sectional configuration.

3. The semiconductor wafer container of claim 1, wherein the wafer protecting grooves are disposed in two rows parallel to axes of the semiconductor wafers retained by the wafer retaining grooves, with a spacing between the two rows.

4. The semiconductor wafer container of claim 1, wherein the wafer protecting grooves have an arcuate shape parallel to the outer edges of the semiconductor wafers as seen in a direction parallel to axes of the semiconductor wafers retained by the wafer retaining grooves.

5. The semiconductor wafer container of claim 1, wherein the wafer protecting grooves are integrally molded with the container body.

* * * * *